United States Patent [19]

Wolf et al.

[11] Patent Number: 5,773,982
[45] Date of Patent: Jun. 30, 1998

[54] PROCESS FOR CHECKING THE EFFICIENCY OF AN ELECTRIC POWER STATION COMPONENT

[75] Inventors: Eckehard Wolf; Lüder Warnken, both of Erlangen; Frantisek Klecka, Alzenau; Hartmut Schulz, Neu-Isenburg; Willi Siegler, Offenbach/Bieber; Anton Knapp, Karlstein; Barbara Richter, Erlangen, all of Germany

[73] Assignee: Siemens Aktiengesellschaft, Munich, Germany

[21] Appl. No.: 730,340

[22] Filed: Oct. 15, 1996

Related U.S. Application Data

[63] Continuation of PCT/DE95/00498 Apr. 11, 1995.

[30] Foreign Application Priority Data

Apr. 15, 1994 [DE] Germany .......................... 44 13 110.0

[51] Int. Cl.$^6$ .................................................. H01H 31/12
[52] U.S. Cl. ............................................................ 324/551
[58] Field of Search ................................. 73/866.6, 866, 73/551; 324/537, 551, 591, 693

[56] References Cited

U.S. PATENT DOCUMENTS

| | | |
|---|---|---|
| 3,664,965 | 5/1972 | Hirota et al. . |
| 3,821,640 | 6/1974 | Bahder et al. ........................ 324/544 |
| 4,095,419 | 6/1978 | Wolf et al. . |
| 4,705,823 | 11/1987 | Choi et al. . |
| 4,839,218 | 6/1989 | Sugino . |
| 4,918,977 | 4/1990 | Takahashi et al. ................... 324/541 |

FOREIGN PATENT DOCUMENTS

| | | |
|---|---|---|
| 2 225 819 | 11/1974 | France . |
| 1 648 340 | 7/1971 | Germany . |
| 29 38 545 A1 | 4/1981 | Germany . |
| 406230070 | 8/1994 | Japan ................................... 324/551 |
| 1156551 | 7/1969 | United Kingdom . |

OTHER PUBLICATIONS

"Flashover performance of artificially contaminated and iced long–rod transmission line insulators", IEEE Trans. on Power Apparatus & System, vol. 99, 1980, pp. 46–52.

*Primary Examiner*—Robert Raevis
*Attorney, Agent, or Firm*—Herbert L. Lerner; Laurence A. Greenberg

[57] ABSTRACT

In an accident involving the uncontrolled escape of coolant, a condensate film forms on the power station components. Due to deposited dirt it is conductive, and if the insulation has aged it can cause electrical function defects. That situation is simulated by spraying a test liquid, having a wetting power (surface tension) and a conductivity which correspond to the coolant condensate, onto the electrical power station components. The testing can be carried out on a routine basis at normal pressure and normal temperature during ongoing reactor operation.

19 Claims, No Drawings

PROCESS FOR CHECKING THE EFFICIENCY OF AN ELECTRIC POWER STATION COMPONENT

CROSS-REFERENCE TO RELATED APPLICATION

This application is a Continuation of International Application Serial No. PCT/DE95/00498, filed Apr. 11, 1995.

BACKGROUND OF THE INVENTION

Field of the Invention

The invention relates to a process for testing the functioning of an electrical power station component, in which the component surface is wetted with a test fluid.

Such a process is known from Published French Patent Application 2,225,819, corresponding to U.S. Pat. No. 3,821,640.

In the case of a coolant loss accident (CL accident), major amounts of steam are generally produced. The resultant condensate wets the building parts and components affected by steam, and especially the electrical systems and the components of the control system, with a moist film. That film becomes conductive by combination with extraneous layers sticking to the component surfaces. If the moistening condensate impairs the function of one of those components or destroys it, for instance because the insulation resistance is reduced, that can mean that the provisions required to control the accident become more difficult.

In order to avoid such damage, all of the components of a power station that could become wetted with condensate in the event of a CL accident are built in such a way that they are not impaired in their function by being wetted under accident conditions. To that end, those components are encapsulated, potted, or equipped with long creep paths, for instance, (so-called coolant loss resistance).

Since as a rule insulation materials age, and thus the coolant loss resistance can drop over the service life of a component, especially from radiation and from component operating conditions, the coolant loss resistance of affected components should be monitored by suitable processes.

SUMMARY OF THE INVENTION

It is accordingly an object of the invention to provide a process for checking the efficiency of an electric power station component, which overcomes the hereinafore-mentioned disadvantages of the heretofore-known processes of this general type, which is a nondestructive test process and which makes it possible to provide a statement about the status of relevant structural parts, especially of electrical and control components in a power station, with a view to coolant loss resistance.

With the foregoing and other objects in view there is provided, in accordance with the invention, a process for the nondestructive testing of the functioning of at least one electrical power station component being wetted with a fluid, especially with coolant escaped in an accident, which comprises wetting a surface of a component with a highly wetting test fluid of defined conductivity; and measuring insulation resistance at the wetted component as a value for the functioning of the component.

In accordance with another mode of the invention, there is provided a process which comprises performing the testing at a temperature between 15° C. and 35° C.

In accordance with a further mode of the invention, there is provided a process which comprises determining a first value that the insulation resistance would assume under conditions of an accident with an escape of coolant, from at least one measured value of a variable determining the insulation resistance.

In accordance with an added mode of the invention, there is provided a process which comprises calculating the first value as a product of a second value of the insulation resistance determined under test conditions and a factor Q, and determining the factor Q from comparison experiments for the component to be investigated.

In accordance with an additional mode of the invention, there is provided a process which comprises wetting the surface with a film of the test fluid of the most uniform and replicable possible thickness.

In accordance with yet another mode of the invention, there is provided a process which comprises spraying on the test fluid.

In accordance with yet a further mode of the invention, there is provided a process which comprises performing the testing act normal atmospheric pressure, in particular approximately 100 kPa.

In accordance with yet an added mode of the invention, there is provided a process which comprises performing the testing on an installed component.

In accordance with yet an additional mode of the invention, there is provided a process which comprises measuring a variable determining a parameter approximately 60 seconds after the test fluid is sprayed on.

In accordance with again another mode of the invention, there is provided a process which comprises spraying the test fluid on a component having non-hygroscopic and largely pressure-proof insulator material.

In accordance with again a further mode of the invention, there is provided a process which comprises dipping the component into the test fluid.

In accordance with again an added mode of the invention, there is provided a process which comprises exposing the test fluid to an overpressure of more than 500 kPa, particularly approximately 650 kPa.

In accordance with again an additional mode of the invention, there is provided a process which comprises measuring a variable determining a parameter approximately 120 seconds after removing the component from the test fluid.

In accordance with still another mode of the invention, there is provided a process which comprises dipping into the test fluid a component with at least one of hygroscopic insulator material and insulator material being deformable under pressure.

In accordance with still a further mode of the invention, there is provided a process which comprises repeating the testing of the function at time intervals, and determining a development in the function over time from various determined values of the insulation resistance.

In accordance with a concomitant mode of the invention, there is provided a process which comprises performing the step of wetting the surface of the component with a largely ion-free test fluid in which a wetting agent is dissolved.

Other features which are considered as characteristic for the invention are set forth in the appended claims.

Although the invention is illustrated and described herein as embodied in a process for checking the efficiency of an electric power station component, it is nevertheless not intended to be limited to the details recited, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

DESCRIPTION OF THE PREFERRED EMBODIMENTS

Referring now to the embodiments of the invention in detail, it is seen that with the test process, wetting is carried out with a highly wetting test fluid of defined conductivity, the wetting of the component by condensate in the event of a coolant loss accident is simulated, and the insulation resistance is determined as a value for its functioning.

Processes of nondestructive material testing can be considered above all for this testing of the power station components. In particular, the way in which electrical parameters (behavior in high-frequency alternating fields, capacitance, development and attenuation of eddy currents, etc.), for instance, vary over time, can be detected and documented by regularly performed tests. Testing of the insulation or of the electrical junction resistance between individual voltage-carrying parts of the power station component can be performed as the simplest and most conclusive provision.

Since this testing process requires no accident conditions, it can be carried out during normal operation of a power station. Preferably, testing of the functioning of the power station component is carried out at a temperature between 150° C. and 350° C. The parameter which is relevant to the functioning is preferably the insulation resistance of the component in this case, which is determined through the use of the process. For example, for a motor drive, in order to determine the functioning, a junction resistance between a terminal clamp of a motor winding and the ground connection, which is not galvanically connected to the winding, can be detected by an active resistance measuring instrument (for instance, a voltage source in which the output current and output voltage are detected), under normal room conditions. Typical measured values range, for instance, between 4.5 and $9.0 \times 10^6$ $\Omega$. The measurements at the same clamps, under the conditions of a coolant loss accident (elevated pressure, elevated temperature, wetting) produce measured values of $10^4$ $\Omega$. The maximum influence of these more-crucial conditions in an accident can be determined for each individual component with a safe limit value, in particular through the use of the ratio of the lowest values under the more-crucial accident conditions to the highest resistance values under normal conditions. The resultant-values are used as a conversion factor Q, for conversion from test conditions to accident conditions. This factor is typically between $10^{-2}$ and $10^{-3}$.

The function of components having a leakage current flow over their insulator surfaces is affected by adhering extraneous layers. The process for checking the function also takes the influence of such extraneous layers, which are moistened by coolant condensate in an accident, into account. For example, if there is a crack in the coolant system of a nuclear reactor filled with light water, the coolant (water), which is at high pressure, escapes at the elevated operating temperature and evaporates. This water vapor also condenses on the various electrical and control components that are necessary for controlling the accident. The combination of condensate and extraneous layer can, because of their conductivity, lead to short circuits in the power supply, to incorrect signals or absent signals, and other defects, which impede the functioning of these components and thus of all of the devices for accident control. An impairment in function can also be promoted by the pressure of the evaporating coolant.

With the process, in particular the functioning of safety-related components is tested, and in particular this testing is repeated at intervals over time. Thus the possibility of incipient functional problems as described above can be detected in good time, and suitable counter measures, such as replacing the threatened components, can be taken. Since the testing is carried out at room temperature, during normal operation or in the normal off-line times of the power station, the process represents an effective, safe provision for increasing the safety of a nuclear power station. Through the use of testing of the power station components, performed optionally at regular intervals, components having a coolant loss resistance which decreases over the course of time can be replaced or repaired in good time.

In order to provide replicability of the aforementioned measurements, good wetting of the surface is necessary, which is achieved by using a-suitable test fluid with adequate wetting properties.

A first alternative for adequate wetting of the surface of the component is to apply a film of the most uniform, replicable possible thickness of a test fluid to the surface. This is preferably carried out by spraying the test fluid onto the surface. This can be accomplished at normal atmospheric pressure, in particular approximately 100 kP. The component may be left in its installed state. It may optionally be favorable, especially if a component is easily removed, to remove it and to perform the testing at a different location. The process can thus be performed simply during power station operation, without additional effort. In order to assure good replicability, it is advantageous to measure a variable that determines the parameter, namely the insulation resistance, that is relevant to the functioning, such as an electric current, electrical resistance or electrical voltage, approximately 60 seconds after the test fluid has been sprayed on. After about 60 seconds, a film of adequate uniformity has as a rule spread over the component, thus assuring the replicability of the measurement. The spraying, so-called spray testing, is preferably carried out in components with non-hygroscopic and largely pressure-proof insulator material.

Another way of performing the process is to dip a power station component into the test fluid. For that purpose, the test fluid is preferably at an overpressure of more than 500 kPa, especially about 650 kPa. This mode of performing the process is therefore also called immersion pressure testing. The component is wetted with the test fluid by dipping the component in the test fluid, so that preferably a variable that determines the parameter is measured about 120 seconds after the component is removed from the test fluid. The duration of the immersion under pressure is determined by the course of the accident to be controlled. If the course over time of the parameters to be monitored can also be determined during the immersion, then it is possible to discontinue the testing as soon as a minimum value is attained and thus it is possible to optionally shorten the duration of the test. Immersion pressure testing is preferably performed with a power station component that has an insulator material surrounding it which is hygroscopic and/or is deformable under pressure.

An ion-free liquid in which a wetting agent is dissolved is preferably used as the test fluid. This takes into account the fact that a cooling system of a nuclear power station contains highly pure deionized water, to which optionally a slight amount, maximally 2200 ppm, of boron is added. In a coolant loss accident of a nuclear power station, the resultant condensate may additionally also contain boron (about 20 ppm), which only insignificantly (by about 0.3 $\mu$S/cm) increases the conductivity of the pure water (which is about 2.5 $\mu$S/cm). It is also advantageous that such a test fluid, which is an aqueous solution with a wetting agent, does not attack the surface of the power station component, so that the functioning of the component remains assured, and the nondestructive testing of functioning can be repeatedly virtually arbitrarily.

Preferably, the test liquid has a surface tension and a conductivity that make it possible to simulate the effects of the coolant condensate. The conductivity and surface tension of the test liquid at the temperature of the measurement are therefore advantageously approximately the same as the conductivity and surface tension of the incident condensate in a coolant loss accident. An extraneous layer on the tested surface accordingly acts in precisely the same way as a corresponding extraneous layer would act in an actual coolant loss accident. In particular, the test liquid used has the requisite conductivity and surface tension in a temperature range from 150° C. to 35° C. Preferably, the surface tension of the test liquid in the temperature range from 15° C. to 350° C., or in other words in the range of normal room temperature, is practically temperature-independent. Checking the function therefore requires no separate tempering of the components or their surroundings. Advantageously, the test liquid contains ingredients or components that could only be harmful to health in an unobjectionable concentration, so that it is easy to use and to dispose of.

The production of such a test fluid can be carried out, for instance, by dilution of a practically nonionic wetting agent with largely deionized water. The wetting agent concentration can be adjusted within wide tolerance limits, without impairing the replicability of the testing. This has the advantage of permitting the test fluid to be easily produced at any power station by diluting a concentrate that can be kept on hand there. Once the process has been performed, the surface of the component can be cleaned of the traces of test fluid and thus of dirt as well by being rinsed with a rinsing medium, which in particular is also deionized water. Thus performing the process for testing the functioning has the additional advantageous side effect of causing the components to be cleaned, which increases the insulation capability of the component in the event of a coolant loss accident. Especially suitable wetting agents of the test fluid are polyglycol ethers, in particular with a content of 0.1±0.05 weight % of a polyglycol ether of the general formula R—$CH_2$—$O(CH_2CH_2O)_n$H, in which R is a radical of a fatty alcohol with a mean chain length of 13 carbon atoms, and n is between 5 and approximately 15, which prove to be especially suitable. The wetting action increases with increasing ethylene oxide, attains an optimal value at n=8, and drops slightly again as the value of n rises further. Accordingly, R—$CH_2$—$O(CH_2CH_2O)_8$H is used as an especially advantageous wetting agent. It has an especially pronounced wetting capacity and moreover is highly water-soluble, especially in the low temperature range.

The invention is distinguished by a process for testing the functioning of an electrical or control component in a power station that can be performed during normal operation or normal off-line periods of the power station, even under normal operating conditions. The process can be carried out nondestructively at normal pressure and at operating temperature of the component, and through the use of measurement at normal conditions it enables conclusions to be drawn as to the functioning of the components in the event of an accident, in which much higher temperatures, higher pressure and greater humidity prevail than when the process is performed. These conclusions are made possible, for instance, because an adequately replicable relationship between the measured insulation resistance under accident conditions and the measured insulation resistance under normal conditions is ascertained before the process is performed, in particular for each individual component, and from this relationship the measured values are converted to the values that would occur in an accident. Through the use of nondestructive testing of the corresponding components, optionally at regular time intervals, the development over time of the functioning of each component can be determined, and the corresponding measurement data can be stored in memory, so that an incipient reduction in functioning under accident conditions can be detected early and suitable counter measures can be initiated. If the memorized measurement data in successive test measurements produce markedly decreasing resistance values, for instance, or in other words indicate the threat of an inability of the component tested to function, then this component can be replaced or repaired. The process and the countermeasures thus initiated therefore increase the safety of a power station, without impairing its normal operation, which is especially decisively advantageous in the case of a nuclear power station.

We claim:

1. A process for the nondestructive testing of the functioning of at least one electrical power station component being wetted with a test fluid simulating a power station coolant released in an electrical power station accident, which comprises:

wetting a surface of a component with a highly wetting test fluid, the test fluid having a surface tension and a conductivity corresponding to a surface tension and a conductivity of a power station coolant released from an electrical power plant during an accident;

measuring insulation resistance at the wetted component, the insulation resistance representing a value for the functioning of the component;

determining a value that the insulation resistance would assume under conditions of an accident with an escape of coolant from at least one measured value of a variable determining the insulation resistance; and calculating the value of the insulation resistance as a product of another value of the insulation resistance determined under test conditions and a factor Q, and determining the factor Q from comparison experiments for the component to be investigated.

2. The process according to claim 1, which comprises performing the testing at a temperature between 15° C. and 35° C.

3. The process according to claim 1, which comprises wetting the surface with a film of the test fluid, the film having a thickness equivalent to a thickness which occurs when the power station coolant is accidentally released and coats the component.

4. The process according to claim 1, which comprises spraying on the test fluid.

5. The process according to claim 4, which comprises performing the testing at normal atmospheric pressure.

6. The process according to claim 4, which comprises performing the testing at approximately 100 kPa.

7. The process according to claim 5, which comprises performing the testing on an installed component.

8. The process according to claim 4, which comprises measuring a variable determining the insulation resistance approximately 60 seconds after the test fluid is sprayed on.

9. The process according to claim 4, which comprises spraying the test fluid on the component having non-hygroscopic and largely pressure-proof insulator material.

10. The process according to claim 1, which comprises dipping the component into the test fluid.

11. The process according to claim 10, which comprises exposing the test fluid to an overpressure of more than 500 kPa.

12. The process according to claim 10, which comprises exposing the test fluid to an overpressure of approximately 650 kPa.

13. The process according to claim 10, which comprises measuring a variable determining the insulation resistance approximately 120 seconds after removing the component from the test fluid.

14. The process according to claim 10, which comprises dipping into the test fluid the component with at least one of hygroscopic insulator material and insulator material being deformable under pressure.

15. The process according to claim 1, which comprises repeating the testing of the function at time intervals, and determining a development in the function over time from various determined values of the insulation resistance.

16. The process according to claim 1, which comprises performing the step of wetting the surface of the component with a largely ion-free test fluid in which a wetting agent is dissolved.

17. The process according to claim 1, which comprises producing the test fluid by diluting a substantially nonionic wetting agent with largely deionized water.

18. The process according to claim 1, which comprises producing the test fluid by diluting polyglycol ether of $0.1\pm0.05\%$ by weight in largely deionized water.

19. The process according to claim 1, which comprises producing the test fluid by diluting polyglycol ether of $0.1\pm0.05\%$ by weight of a formula $R-CH_2-O(CH_2CH_2O)_nH$, in which R is a radical of a fatty alcohol with an average chain length of 13 carbon atoms, and n is between 5 and approximately 15, in largely deionized water.

* * * * *